(12) United States Patent
Park et al.

(10) Patent No.: US 6,934,006 B2
(45) Date of Patent: Aug. 23, 2005

(54) EXPOSURE APPARATUS AND EXPOSURE METHOD FOR USE IN FORMING A PATTERN OF A SEMICONDUCTOR DEVICE

(75) Inventors: Tae-Sin Park, Yongin-si (KR); Bong-Ki Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/419,954

(22) Filed: Apr. 22, 2003

(65) Prior Publication Data

US 2004/0004700 A1 Jan. 8, 2004

(30) Foreign Application Priority Data

Jul. 5, 2002 (KR) .......................... 2002-38999

(51) Int. Cl.[7] .................. G03B 27/42; G03B 27/58; G03B 27/32
(52) U.S. Cl. ................. 355/53; 355/72; 355/77
(58) Field of Search .................. 355/53, 77, 55, 355/71, 67, 72; 250/548, 492.2; 356/683; 430/311, 394

(56) References Cited

U.S. PATENT DOCUMENTS

| | | |
|---|---|---|
| 5,329,335 A | 7/1994 | Wada et al. |
| 5,526,093 A | 6/1996 | Takahashi |
| 5,706,076 A | 1/1998 | Takeda |
| 5,747,221 A | 5/1998 | Kim et al. |
| 5,781,277 A | 7/1998 | Iwamoto |
| 5,842,824 A | 12/1998 | Nishi |
| 5,933,216 A * | 8/1999 | Dunn .................. 355/53 |
| 6,281,965 B1 * | 8/2001 | Nakashima ............. 355/53 |
| 6,600,550 B1 * | 7/2003 | Shigematsu ............ 355/53 |
| 2003/0103196 A1 * | 6/2003 | Hirukawa ............. 355/55 |
| 2003/0142284 A1 * | 7/2003 | Lin .................... 355/77 |
| 2003/0193624 A1 * | 10/2003 | Kobayashi et al. ..... 349/42 |

* cited by examiner

*Primary Examiner*—Peter B. Kim
(74) *Attorney, Agent, or Firm*—Volentine Francos & Whitt PLLC

(57) ABSTRACT

An exposure apparatus for exposing a photoresist film formed on a semiconductor substrate includes a plurality of reticle stages on which respective reticles can be supported at the same time. The reticles can be selectively and hence, successively, positioned along the optical axis of the apparatus that extends from the light source of the apparatus to a substrate stage. One region of the photoresist film is exposed to light directed through the first reticle. Then the second reticle stage is aligned and another region of the photoresist film is exposed to light directed through the second reticle.

5 Claims, 6 Drawing Sheets

← ROT →

EXPOSURE APPARATUS AND EXPOSURE METHOD FOR USE IN FORMING A PATTERN OF A SEMICONDUCTOR DEVICE

BACKGROUND OF THE INVENTION

1. Field of the Invention

The present invention relates to an exposure apparatus employed in a semiconductor manufacturing process and to an exposure method using the same. More particularly, the present invention relates to a method of and apparatus for exposing selected portions of a photoresist film using a reticle to form a photoresist pattern.

2. Description of the Related Art

Recently, semiconductor devices have been rapidly improved to advance the development of information processing devices such as computers. Semiconductor devices must, therefore, perform at high speeds and possess a large storage capacity. To this end, current semiconductor manufacturing processes are aimed at improving the integration, the reliability and the response speed of semiconductor devices. Hence, advances in the art are concentrating on micro-processing techniques, such as photolithography, to meet this demand for highly integrated semiconductor devices.

As is well known in the art, photolithography is a process in which a semiconductor substrate is coated with an organic photoresist to form a photoresist film on the substrate, and the image of a reticle is transferred to the photoresist film by directing ultraviolet light through the reticle and onto the photoresist film. More specifically, the photoresist film is composed of an organic material whose solubility relative to an alkaline solution changes when exposed to light such as ultraviolet rays or X-rays. The reticle bears a pattern and is positioned over the substrate, and the light is selectively applied to the photoresist film using the pattern of the reticle as mask to thereby selectively expose a predetermined portion of the photoresist film. Then, the photoresist film is developed using a developing solution. Whereas that portion of the photoresist film having high solubility to the developing solution is removed, the portion of the photoresist film having a low solubility remains (for example, the exposed portion of the photoresist film in case of a positive-typed photoresist film). As a result, a photoresist pattern is formed on the semiconductor substrate. The photoresist pattern is, in turn, used to pattern another layer, such as a metal layer, on the semiconductor device to produce a wiring pattern, for example, of the semiconductor device.

Examples of exposure apparatus for performing such an exposure process are disclosed in U.S. Pat. No. 5,706,076 (issued to Minoru Takeda), U.S. Pat. No. 5,781,277 (issued to Kazunori Iwamoto), U.S. Pat. No. 5,526,093 (issued to Kazuhiro Takahachi), and U.S. Pat. No. 5,842,824 (issued to Kenji Nishi) etc.

FIG. 1 shows part of a conventional exposure apparatus. Referring to FIG. 1, the conventional exposure apparatus has a stage 12 for supporting a semiconductor substrate W, a lens 14, a reticle stage 16 for supporting a reticle 18, and a light source (not shown). The reticle stage 16 is precisely aligned with the stage 12 and hence, with the semiconductor substrate W. Light generated by the light source passes through a beam concentrator (not shown), whereby the rays of light are made parallel. The light is then directed through the reticle 18. The reticle 18 bears an image, which is incident on the lens 14. The image of the incident light is projected by the lens 14 on a reduced scale onto the photoresist film on the semiconductor W. Accordingly, the light exposes a predetermined portion of the photoresist film on the semiconductor substrate W.

In general, the alignment margins of the exposure process become smaller and the steps on semiconductor substrates becomes greater as semiconductor devices become more highly integrated and the semiconductor substrates from which the devices are made become larger. If the step between a region A and a region B of the semiconductor substrate is large in accordance with this trend, e.g., is at least approximately 0.5 μm, it becomes impossible to secure the focus margin required for forming a pattern having the desired critical dimension (CD). Hence, the semiconductor substrate may be polished to reduce the step on the semiconductor substrate. Alternatively, to overcome the limitations imposed by a large step on the semiconductor substrate in attaining the necessary focus margin, a first reticle and a second reticle may be used to respectively expose the photoresist film at regions A and B of the semiconductor substrate.

FIG. 2 is a flow chart illustrating such a method for forming a pattern on a semiconductor substrate using a conventional exposure apparatus. In particular, the method shown in FIG. 2 is used to form a wiring pattern on a semiconductor substrate, having a large step between a region 'A' and a region 'B' thereof. Thus, the photoresist pattern is formed using a first reticle and a second reticle, respectively.

Referring now to FIG. 2, the first reticle bearing a pattern 'A' is aligned with and loaded on a reticle stage (step S10).

Light is directed through the first reticle and a projection-reduction lens onto region A of the semiconductor substrate, whereby that portion of the photoresist film in region A is exposed and hence, reacts with the light (step S20). Then, the portion of the photoresist film that has reacted with the light is removed using a developing solution to produce a first photoresist pattern in region A of the semiconductor substrate (S30).

An overlay of the first photoresist pattern is measured (step S40), and then optimal conditions of the exposure time and the focus margin relative to the first photoresist pattern are measured using a scanning electron microscope (SEM) (step S50).

The semiconductor substrate is then checked to confirm the integrity of the photoresist pattern and to determine the level of particles present on the first photoresist pattern (step S60). If these conditions are satisfactory, a layer(s) on the semiconductor substrate is patterned using the first photoresist pattern as an etching mask (step S70).

After the first photoresist pattern is removed (step S80), the semiconductor substrate is cleaned in order to remove particles from the semiconductor substrate and in particular, from the patterned layer(s) now formed thereon (step S90).

Subsequently, desired patterns are formed on region B of the semiconductor substrate with a second reticle using a sequence of steps (steps S100, S110, S120, S130, S140, S150, S160, S170 and S180) similar to those described above.

Thus, as described above, when the step between region A and region B of the semiconductor substrate is at least approximately 0.5 μm, a photoresist pattern can be formed on the semiconductor substrate by performing photolithography processes at regions A and B of the substrate using first and the second reticles having different patterns. However, this technique adds to the cost of the semiconductor device manufacturing process while limiting the productivity of the manufacturing process because the photolithography and etching processes must be performed twice to form one wiring pattern at the stepped portion of the semiconductor substrate.

FIG. 3 is a plan view of the conventional reticle and the shots on the semiconductor substrate exposed using the reticle according to another aspect of the photolithography process. Referring to FIG. 3, the exposure process should be executed adjacent the outer peripheral edge portion of the semiconductor substrate W using only part of the overall pattern to prevent the edge portion of the semiconductor substrate W from being damaged during an exposure process. Thus, the exposure process in this respect requires at least two patterns: a whole pattern and a partial pattern. To this end, a reticle 18 defines first and second patterns 19a and 19b thereon. In this exposure process, a shot is taken using the first pattern 19a to form a main pattern at reference region 20a of a photoresist film formed on the inner portion of the semiconductor substrate W. Then a shot is taken using the second pattern 19b to form the partial pattern at region 20b of a photoresist film formed at the outer peripheral edge portion of the semiconductor substrate W.

However, the exposure process performed using the reticle 18 having the first and second patterns 19a and 19b limits the throughput of the semiconductor manufacturing process because the sizes of the patterns that can be borne by the single reticle 18 are, in turn, limited. In addition, even in a case in which exposure processes are carried out in succession using two reticles having different patterns, the throughput remains limited and the possibility of the misalignment of the reticles remains strong as the process requires the exchange of the reticles on a single reticle stage.

SUMMARY OF THE INVENTION

An object of the present invention is to overcome the above-described limitations of the prior art. Accordingly, objects of the present invention are to increase the throughput of a process for forming a pattern of a semiconductor device using an exposure apparatus/method that is not prone to creating a mis-alignment between reticles and a layer on a semiconductor substrate.

More specifically, it is an object of the present invention to provide an exposure method and apparatus that do not require the exchanging of reticles on a reticle stage to carry out an exposure process in which patterns of two or more reticles are to be transcribed onto a photoresist film at respective regions thereof. It is likewise an object of the present invention to provide a method of forming a pattern of a semiconductor device using such an exposure apparatus/method.

An exposure apparatus according to the present invention includes a light source, a substrate stage, and a reticle stage system having a plurality of reticle stages and interposed between the light source and the substrate stage with respect to the optical axis of the apparatus. Each of the reticle stages is configured to support a respective reticle thereon. The reticle stages are selectively positionable in the path of the optical axis of the apparatus.

In an exposure method according to the present invention, a first reticle and a second reticle bearing different patterns are loaded on a first one of the reticle stages and a second one of the reticle stages, respectively. The first reticle stage is then aligned with a first region of a photoresist film formed on a semiconductor substrate. Light from the light source is directed through the first reticle and onto the first region of the photoresist film, thereby exposing a selected portion of said first region such that the image of the pattern borne by the first reticle is transcribed onto the photoresist film at its first region. Next, the second reticle stage is aligned with a second region of the photoresist film and the exposure light is directed through the second reticle and onto the second region of the film. Accordingly, a selected portion of the second region of the photoresist film is exposed to the light such that the image of the pattern borne by the second reticle is transcribed onto the second region.

In furtherance of this technique to form a pattern, e.g., a metal wiring pattern, of a semiconductor device, the exposed regions of the photoresist film are subsequently developed to form a photoresist pattern, and the resultant structure is etched using the photoresist pattern as a mask.

According to the present invention, two reticles are simultaneously supported and aligned on two reticle stages so as to readily replace each other when a photoresist pattern is formed on a semiconductor substrate. That is, respective regions of the photoresist film can be successively and repeatedly exposed to light from the light source passed through the reticles without removing either of the reticles from the reticle stage on which it is supported. Therefore, a semiconductor device manufacturing process employing the present invention can have a high throughput, and there is little chance that the reticles will be mis-aligned relative to a layer previously formed on the semiconductor substrate.

BRIEF DESCRIPTION OF THE DRAWINGS

The above and other objects, features and advantages of the present invention will become readily apparent by referring to the following detailed description thereof made in conjunction with the accompanying drawings, of which.

DETAILED DESCRIPTION OF THE PREFERRED EMBODIMENTS

Figure 1:
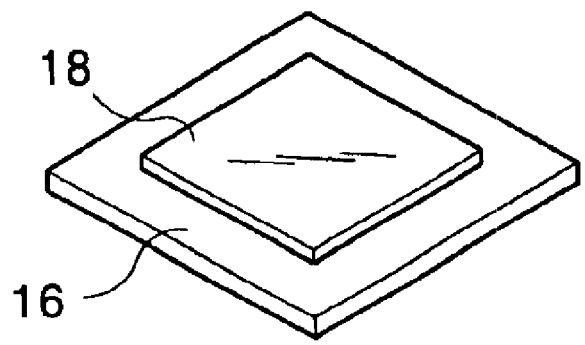
FIG. 1 is a schematic perspective view of essential components of a conventional exposure system.
Figure 1:
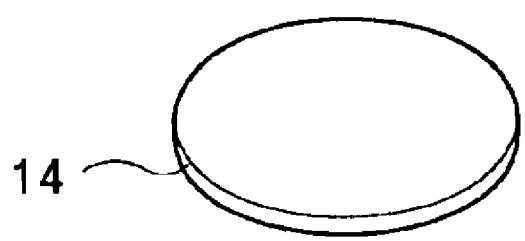
Figure 1:
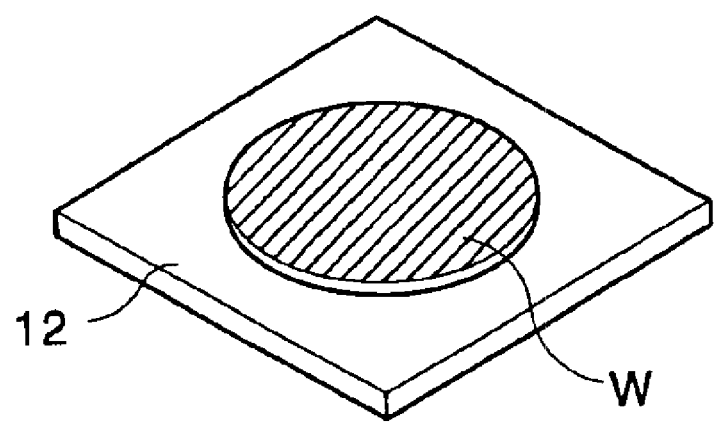
Figure 2:
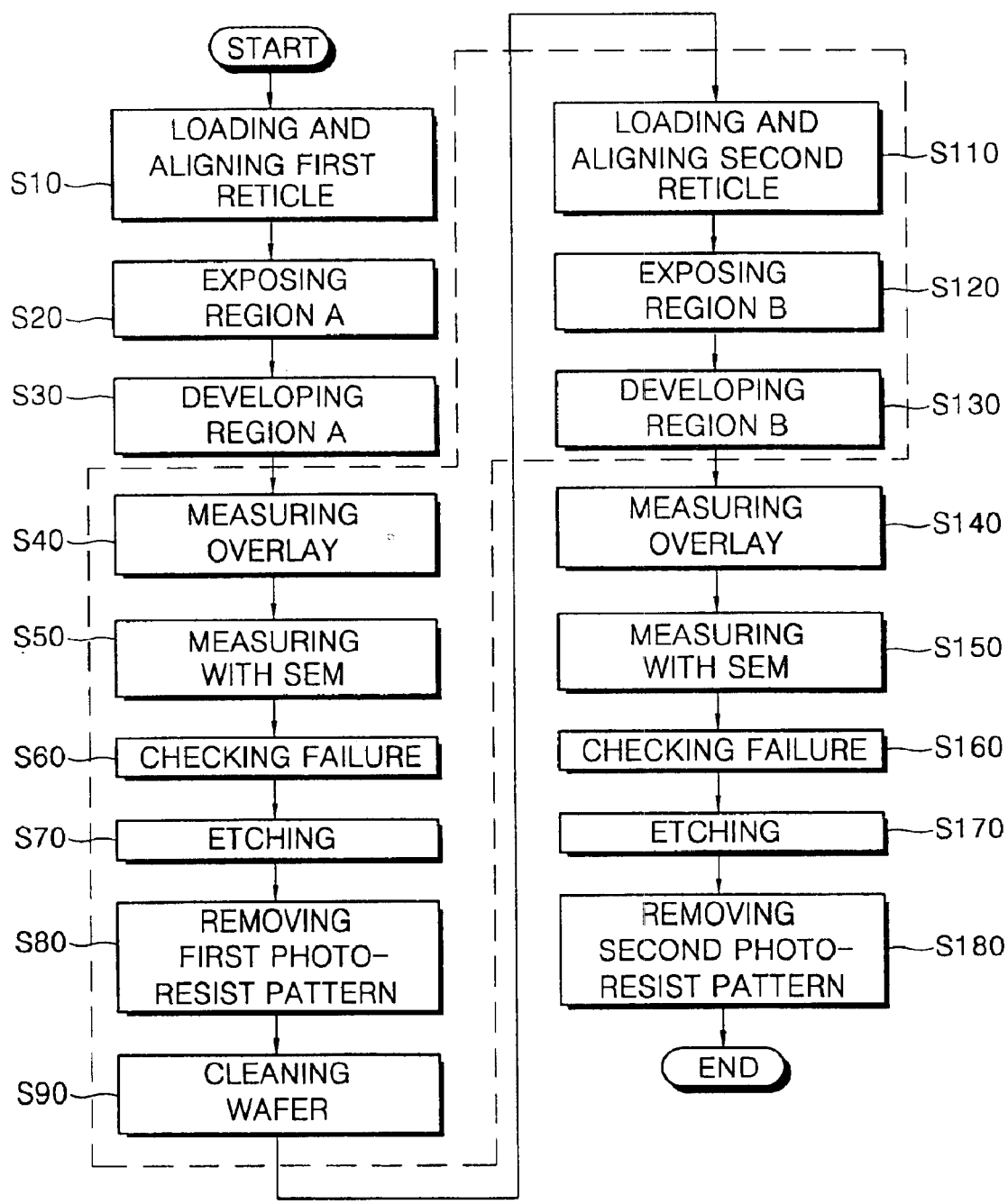
FIG. 2 is a flow chart illustrating a method of forming a pattern on a semiconductor substrate using the conventional exposure apparatus.
Figure 3:
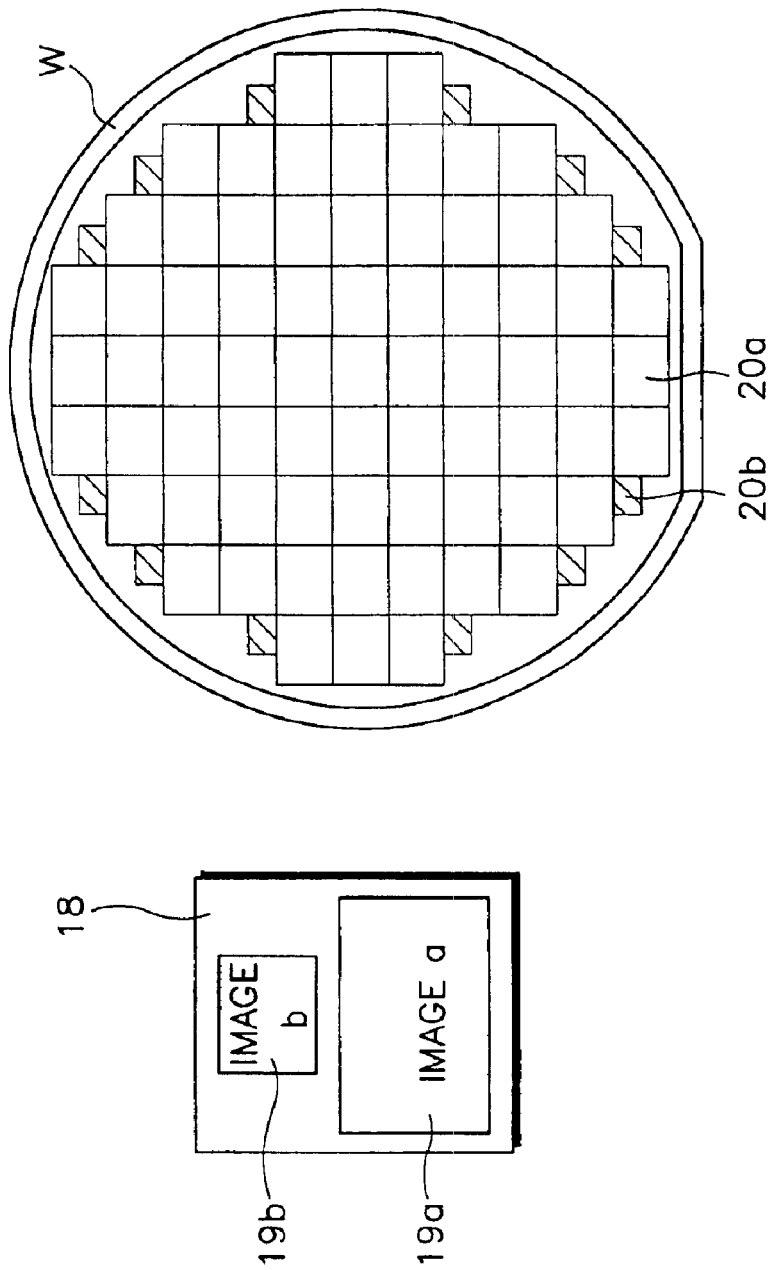
FIG. 3 is a plan view of a conventional reticle and shots on a semiconductor substrate exposed using the reticle.

The preferred embodiments of the present invention will be described in detail hereinafter with reference to the accompanying drawings. In the following drawings, like reference numerals are used to designate similar or identical elements.

Figure 4:
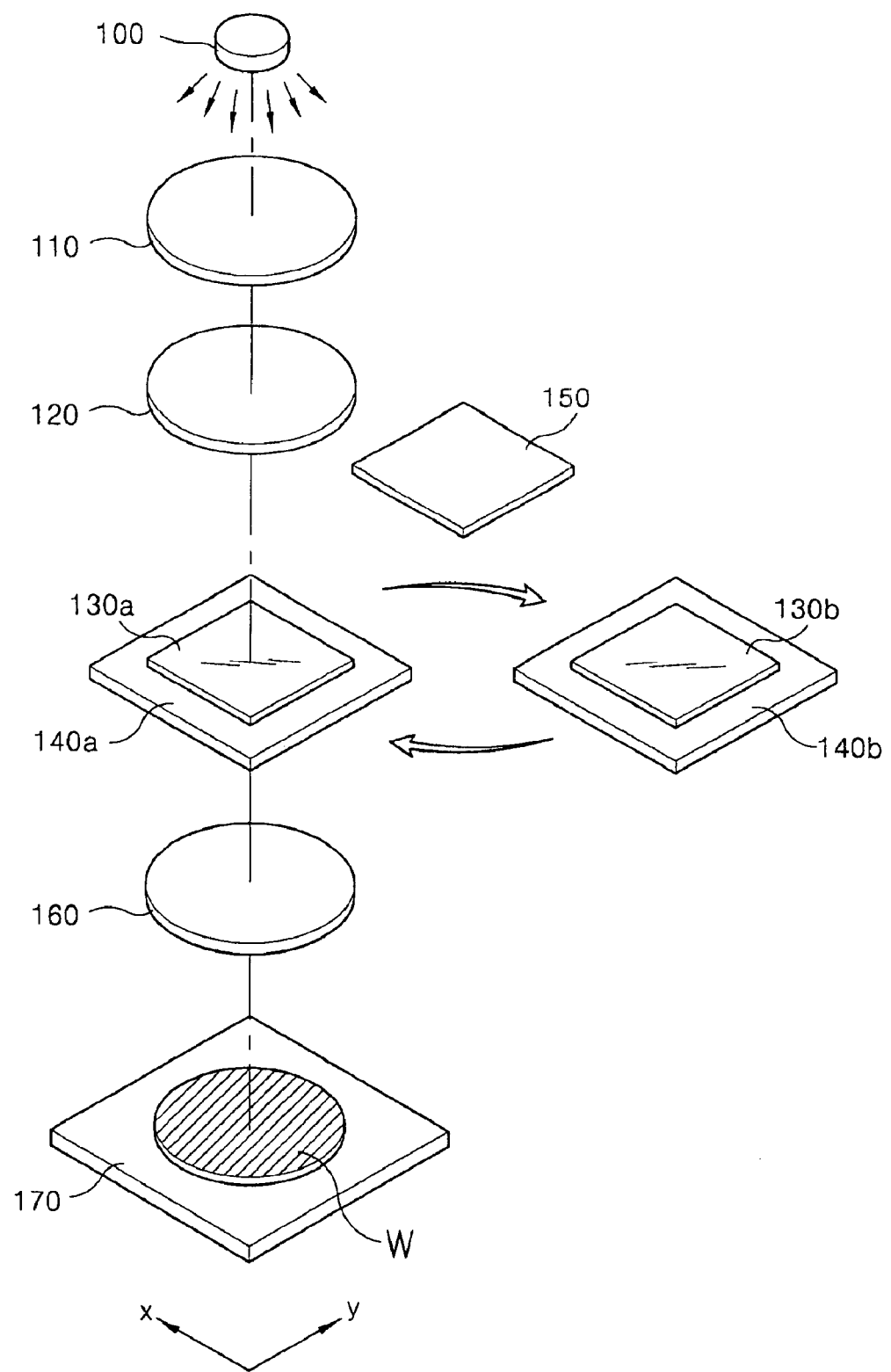
FIG. 4 is a schematic perspective view of an exposure apparatus for manufacturing a semiconductor device according to the present invention.

Referring to FIG. 4, the exposure apparatus of the present invention has a light source 100, an alignment lens system 110, a converging lens 120, two reticles 130a, 130b, a reticle stage system comprising two reticle stages 140a, 140b and a stage selection member 150, a projection lens 160, and a substrate stage 170.

The light source 100 provides light of a wavelength capable of reacting with a photoresist film formed on a semiconductor substrate W. In particular, the light source 100 produces infra-violet rays or ultraviolet rays in a vacuum.

The alignment lens system 110 includes a number of micro-lenses that convert the light emanating from the light source 100 into parallel rays of light. The alignment lens system 110 is disposed between the light source 100 and the converging lens 120, with respect to the optical axis of the apparatus, such that the parallel rays of light are incident on the converging lens 120.

The converging lens 120 is disposed between the alignment lens system 110 and the reticle stages 140a, 140b. The converging lens 120 directs the parallel rays of light onto a portion of the photoresist film. To this end, the converging lens 120 focuses the light onto the opaque chrome pattern of a selected one of the reticles 130a, 130b. The reticles 130a, 130b are employed when a step is present between a region A and a region B of the semiconductor substrate W. More specifically, the first reticle 130a has a first pattern designed for exposing the photoresist film at region A of the semiconductor substrate W, while the second reticle 130b has a different pattern designed for exposing the photoresist film at region B of the semiconductor substrate W.

Also, the reticles 130a and 130b may be provided with different patterns designed to prevent processing failures and loss of throughput when an exposure process is executed adjacent the edge portion of the semiconductor substrate W. More specifically, the first reticle 130a has the pattern of a main shot for use in exposing the photoresist film at an inner portion of the substrate W. On the other hand, the second reticle 130b has the pattern of a partial shot, i.e., corresponding to only part of the main shot, for use in exposing the photoresist film adjacent the outer peripheral edge of the semiconductor substrate W and thereby preventing the edge portion of the semiconductor substrate W from being damaged during the exposure process.

The first and the second reticles 130a and 130b are initially mounted or otherwise loaded on the reticle stages 140a and 140b, respectively, when a photoresist pattern is to be formed on the semiconductor substrate W. For example, the first reticle 130a is loaded on the first reticle stage 140a, and then the first reticle 130a is aligned relative to the wiring (that has been formed using an alignment mark) in the region A of the semiconductor substrate W and hence, is aligned relative to a region of the photoresist film corresponding to region A. In addition, the second reticle 130b is loaded on the second reticle stage 140b and is aligned relative to the wiring (that has been formed using the alignment mark pattern) in region B of the semiconductor substrate W.

To prevent the edge portion of the semiconductor substrate W from being damaged during the exposure process, in another application of the present invention, the first reticle stage 140a may support and align a first reticle 130a having the pattern of a main shot used for exposing the photoresist film at inner portions of the semiconductor substrate W, whereas the second reticle stage 140b may support and align a second reticle 130b having the pattern of a partial shot used for exposing the photoresist film adjacent an outer peripheral edge portion of the semiconductor substrate W.

The selection member 150 is disposed adjacent the reticle stages 140a, 140b. The selection member 150 can select the first reticle stage 140a on which the first reticle 130a is supported for the exposure process, i.e., for the exposing of the photoresist film at a region A or at an inner portion of the semiconductor substrate W. The selection member 150 is also used to select the second reticle stage 140b on which the second reticle 130b is supported for the exposure process, i.e., for the exposing of the photoresist film at a region B or at an outer edge portion of the semiconductor substrate. That is, the selection member 150 is used to successively expose the photoresist film at regions A and the B the substrate W or to successively expose the photoresist film at inner and edge portions of the substrate W. To this end, the selection member 150 may be a drive mechanism to which the reticle stages are mounted. In this case, the selection member 150 is of any suitable type that can be manipulated to move either of the reticle stages 140a, 140b and hence, the reticle supported thereon, into the path of the optical axis of the exposure apparatus. Alternatively, the selection member 150 may comprise optics that shift the optical axis between the reticles 130a, 130b supported on the reticle stages 140a, 140b.

The projection lens 160 is disposed between the reticle stages 140a, 140b and the substrate stage 170 again, with respect to the optical axis of the apparatus. First, the light is converged on the first reticle 130a or the second reticle 130b. Then, the light passes through the reticle 130a or 130b and the projection lens 160 projects the light on a reduced scale onto the semiconductor substrate W on which the photoresist film is formed.

As mentioned above, the substrate stage 170 supports the semiconductor substrate W. The substrate stage 170 is movable along an X-axis direction and a Y-axis direction (two orthogonal directions) so that the desired portion of the photoresist pattern precisely located in alignment with the light projected by the projection lens 160.

Figure 5:
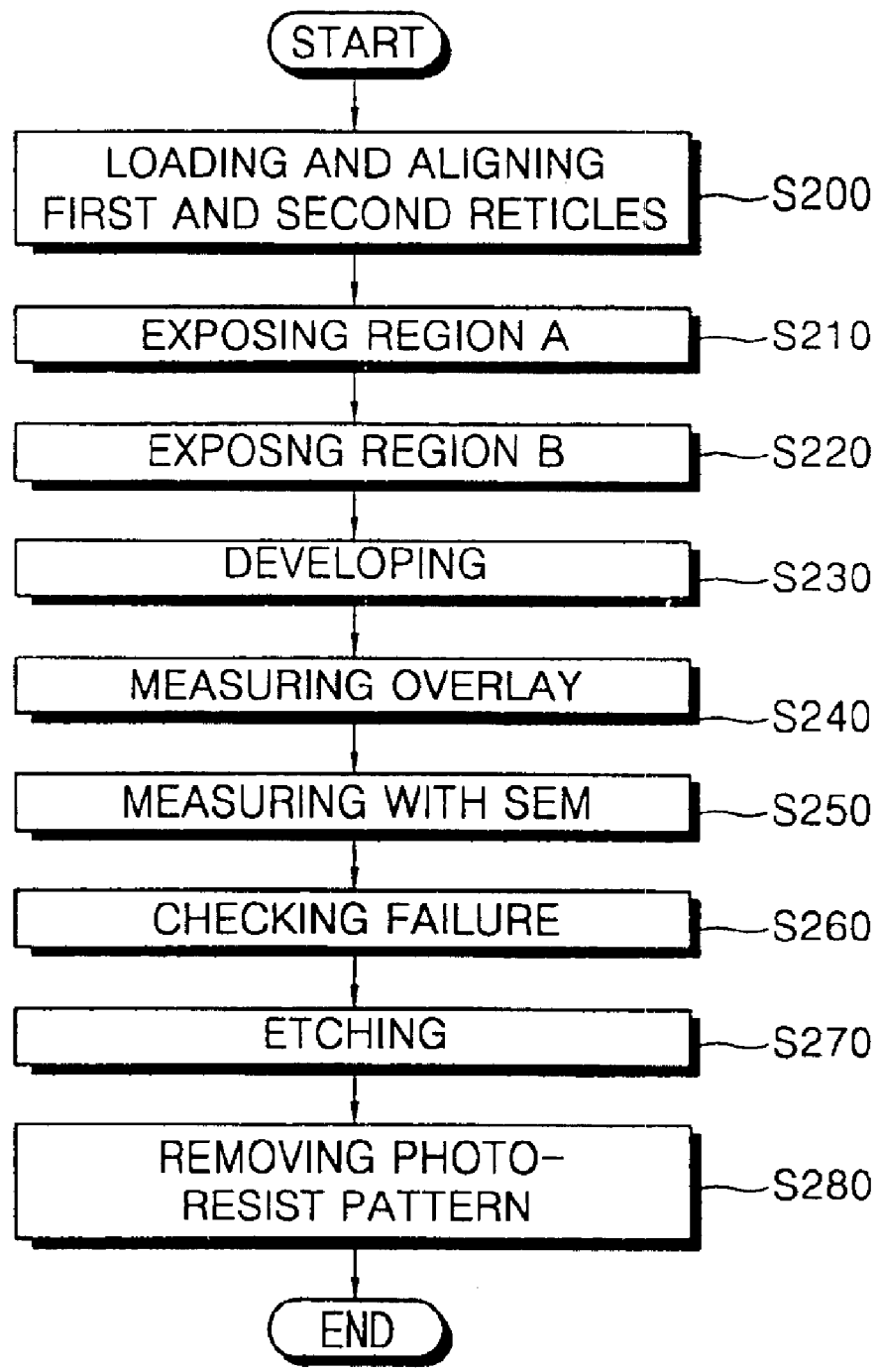
FIG. 5 is a flow chart illustrating a method of forming a pattern on a semiconductor substrate according to the present invention.

FIG. 5 illustrates a method of forming a pattern of a semiconductor device according to the present invention. Referring FIG. 5, when the step between a region A and a region B of the semiconductor substrate is above approximately 0.5 $\mu$m, the exposure process is to form different patterns in the photoresist film at the regions A and B, respectively. To this end, a first reticle and a second reticle are simultaneously loaded on a first reticle stage and a second reticle stage, respectively. In this case, the first reticle bears one pattern, whereas the second reticle bears a different pattern.

After the values for the exposure time and the focus margin of the exposure process are determined for each region of the semiconductor substrate, and the first reticle or the second reticle is aligned with the semiconductor substrate using, for example, an alignment mark on the substrate (step S200).

For instance, the first reticle stage on which the first reticle is loaded is selected such that the first reticle stage is disposed over the region A of the semiconductor substrate. Thus, the light generated by the light source of the exposure apparatus passes through the first reticle so as to form an image corresponding to that of the pattern of the first reticle. Then the light is directed through by the projection lens of the exposure apparatus onto the photoresist film at A region of the semiconductor substrate (step S210).

Subsequently, the second reticle stage on which the second reticle is loaded is selected so that the second reticle stage is disposed over the region B of the semiconductor substrate. The light generated by the light source passes through the second reticle so as to form an image corresponding to that of the second pattern (the pattern of the second reticle). Then the light is directed through by the projection lens of the exposure apparatus onto the photoresist film at region B of the semiconductor substrate (step S220).

The photoresist pattern is formed by developing the photoresist film that has reacted with the light applied thereto at regions A and B of the semiconductor substrate (step S230). Subsequently, the photoresist pattern is baked to remove a solvent from the photoresist pattern, whereupon the photoresist pattern becomes hard enough to endure subsequent thermal processes.

After the overlay of the hardened photoresist pattern is measured (step S240), optimal values of the exposure time and the focus margin are determined by measuring the photoresist pattern formed on the semiconductor substrate using an SEM (step S250). Then, process failures are checked for using the SEM, namely whether the photoresist pattern has been formed satisfactorily and whether a certain level of particles have accumulated on the photoresist pattern (step S260).

A layer on the semiconductor substrate is selectively etched using the photoresist pattern as an etching mask to form a pattern of the semiconductor device (step S270). Subsequently, the photoresist pattern remaining on the semiconductor substrate is removed using an ashing process (step S280).

Figure 6:
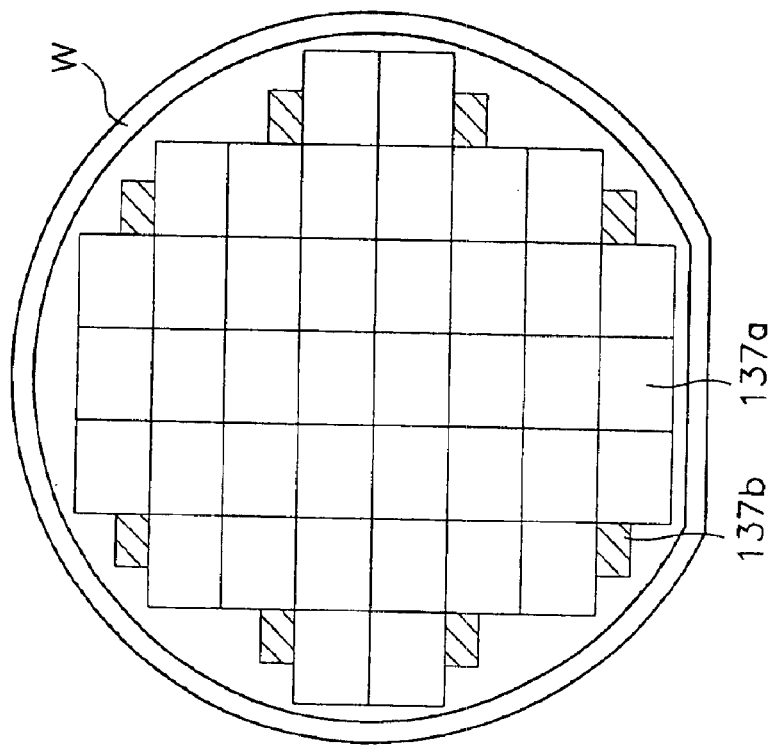
FIG. 6 is a schematic plan view of the reticle and the shots exposed on the semiconductor substrate using the reticle according to the present invention.
Figure 6:
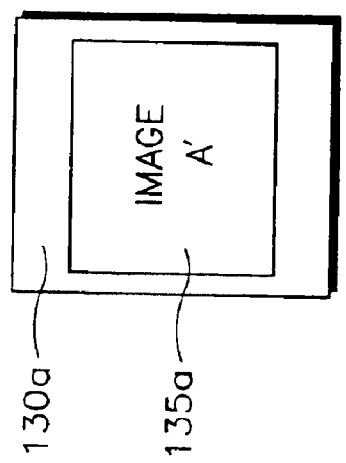
Figure 6:
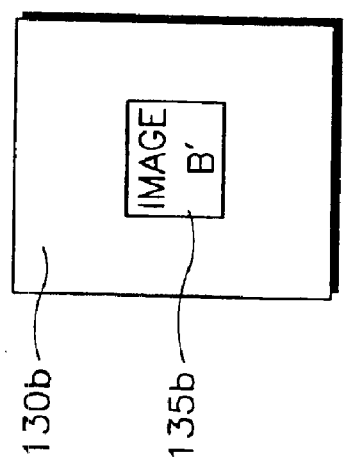

FIG. 6 illustrates another application of the present invention. In this application, the semiconductor substrate is divided into regions based on the pitch of the shot taken during the exposure process. In this case, one shot is taken during each exposure process, and the pitch of the shot refers to the size or area of the shot measured in the plane defined by the X-axis and Y-axis directions.

When the semiconductor substrate W has the shape of a disc as is typical in the art, the first reticle 130a will have a main shot pattern 135a designed and dedicated for exposing the photoresist film at the inner portions of the semiconductor substrate W. On the other hand, the second reticle 130b will have a partial shot pattern 135b. The partial shot pattern 135b has a size that is half or less the pitch of the main shot pattern 135a and is dedicated to expose the photoresist film at the outer peripheral edge portions of the semiconductor substrate W.

In contradistinction to the prior art in which the conventional reticle has two patterns, according to the present invention, two separate reticles 130a and 130b are employed wherein the main pattern 135a of the first reticle 130a is larger than that of the conventional reticle and the second reticle 130b has a pattern 135b that is half the size of the main pattern.

The semiconductor substrate W is thus divided according to the pitch into main shot regions 137a, and partial shot regions 137b. The sizes of the main shot regions 137a and partial shot regions 137b are in proportion to the patterns 135a, 135b of the reticles 130a and 130b, respectively. A maximum number of the main regions 137a are defined at an inner portion of the semiconductor substrate W such that none of the main regions 137a occupy the outer peripheral edge portion of the semiconductor substrate W. The portions of the photoresist film at each of these regions 137a are each exposed using the reticle 130a supported on a stage 140a. The partial regions 137b of the semiconductor substrate are defined, wherever space allows, adjacent the outer peripheral edge portion of the semiconductor substrate W by taking the shot of the part shot pattern 135b. Thus, the portions of the photoresist film at these regions 137b are each exposed using the reticle 130b supported on a stage 140b. Hence, a maximum area of the photoresist film can be exposed without exposing the outer peripheral edge portion of the substrate W that is not covered by the film.

When the exposure processes are executed using the first and the second reticles 130a and 130b aligned with their respective stages 140a, 140b, respectively, fewer shots are required to expose the entire area of the photoresist film than compared to the prior art because the reticle patterns 135a, 135b borne by discrete reticles 130a, 130b can be larger than the counterpart reticle patterns borne by a single reticle of the prior art.

As can be understood from the description above, according to the present invention, a reticle supported on a reticle stage does not have to be replaced during a process of forming a semiconductor device pattern. Thus, the present invention reduces the possibility of a mis-alignment between the reticle being used in the exposure process and a layer (underlying the photoresist film) on the semiconductor substrate. In addition, in the case that a step is present on the semiconductor substrate, the present invention can be used to enhance the throughput of the manufacturing process and save costs in the manufacturing process because an adequate focus margin can be secured for forming the patterns of the semiconductor device at such a stepped region without the need to reduce the step using a polishing process (for example, a chemical-mechanical polishing process). In the case in which the present invention is being used to expose portions of a photoresist film corresponding to main and partial shot regions, the present invention can be used to enhance the throughput of the manufacturing process and save costs in the manufacturing process because comparatively large main shots can be taken.

Although the present invention has been described with respect to the preferred embodiments thereof, modifications and variations thereof will become apparent to those skilled in the art. Therefore, changes may be made to the preferred embodiments of the present invention within the true spirit and scope of the invention as defined by the appended claims.

What is claimed is:

1. An exposure apparatus for exposing selected portions of a photoresist film formed on a semiconductor substrate, said apparatus comprising:

a light source that generates light of a wavelength that will react with the photoresist film when the photoresist is exposed to the light;

a substrate stage configured to support the substrate;

a reticle stage system interposed between said light source and said substrate stage with respect to an optical axis of the apparatus extending from said light source to said substrate stage, said reticle stage system including a plurality of discrete reticle stages each configured to support a respective reticle thereon, each of said reticle stages being selectively positionable in the path of said optical axis while the others of said reticle stages are disposed out of the path of said optical axis such that reticles supported on said reticle stages can be irradiated in sequence with light from said light source, whereby respective regions of the photoresist film can be successively exposed to light from said light source passed through the reticles supported by said reticle stages, respectively, without removing either of the reticles from the reticle stage on which it is supported;

a first reticle supported on one of said reticle stages and bearing a main shot pattern designed for exposing the photoresist film at an inner region of the substrate;

a second reticle supported on another of said reticle stages and bearing a partial shot pattern that includes only part of the main shot pattern and designed for exposing a portion of the photoresist film adjacent an outer peripheral edge of the substrate; and a reduction-projection lens interposed between said reticle stage system and said substrate stage with respect to said optical axis of the apparatus so as to project an image formed by incident light thereon onto the photoresist film on a reduced scale.

2. An exposure method for use in manufacturing a semiconductor device, said method comprising:

loading a first reticle and a second reticle on a first reticle stage and a second reticle stage, respectively, the first reticle bearing a main shot pattern designed for exposing a portion of photoresist film at an inner region of a substrate, and the second reticle bearing a partial shot pattern that includes only a part of the main shot pattern and designed for exposing a portion of the photoresist film adjacent an outer peripheral edge of the substrate;

subsequently aligning the first reticle stage with a selected portion of the photoresist film at the inner region of the substrate and directing light from a light source through the first reticle and onto the selected portion of the photoresist film at the inner region while the second reticle is in a standby state in which the second reticle is not illuminated by light from the light source, thereby exposing the selected portion of the photoresist film at the inner region to the light such that an image of the main shot pattern borne by the first reticle is transcribed onto the photoresist film at the inner region; and subsequently aligning the second reticle stage with a selected portion of the photoresist film adjacent the outer peripheral edge of the substrate and directing light from said light source through the second reticle and onto the selected portion of the photoresist film adjacent the outer peripheral edge of the substrate while the first reticle is in a standby state in which the second reticle is not illuminated by light from the light source, thereby exposing the selected portion of the photoresist film adjacent the outer peripheral edge of the substrate to the light such that an image of the partial shot pattern borne by the second reticle is transcribed onto the selected portion of the photoresist film adjacent the outer peripheral edge of the substrate.

3. The exposure method of claim 2, wherein said aligning of the first reticle stage with the selected portion of a photoresist film at the inner region of the substrate comprises setting the first reticle stage in an alignment position at which the first reticle stage is disposed in the path of an optical axis extending between the light source and a substrate stage that supports the substrate, and said aligning of the second reticle stage with the selected portion of the photoresist film adjacent the outer peripheral edge of the substrate comprises switching the first and second reticle stages such that the second reticle stage is moved to said alignment position and the first reticle stage is moved from said alignment position to a standby position out of the path of the optical axis.

4. A method of forming a pattern of a semiconductor device, said method comprising:

loading a first reticle and a second reticle on a first reticle stage and a second reticle stage, respectively, the first reticle bearing a main shot pattern designed for exposing a portion of photoresist film at an inner region of a substrate, and the second reticle supported bearing a partial shot pattern that includes only part of the main shot pattern and designed for exposing a portion of the photoresist film adjacent an outer peripheral edge of the substrate;

subsequently aligning the first reticle stage with a selected portion of the photoresist film at the inner region of the substrate and directing light from a light source through the first reticle and onto the selected portion of the photoresist film at the inner region while the second reticle is in a standby state in which the second reticle is not illuminated by light from the light source, thereby exposing the selected portion of the photoresist film at the inner region to the light such that an image of the main shot pattern borne by the first reticle is transcribed onto the photoresist film at the inner region;

subsequently aligning the second reticle stage with a selected portion of the photoresist film adjacent the outer peripheral edge of the semiconductor substrate and directing light from said light source through the second reticle and onto the selected portion of the photoresist film adjacent the outer peripheral edge of the substrate while the first reticle is in a standby state in which the second reticle is not illuminated by light from the light source, thereby exposing the selected portion of the photoresist film adjacent the outer peripheral edge of the substrate to the light such that an image of the partial shot pattern borne by the second reticle is transcribed onto the selected portion of the photoresist film adjacent the outer peripheral edge of the substrate;

subsequently developing the photoresist film to form a photoresist pattern; and etching the resultant structure comprising the substrate using the photoresist pattern as a mask.

5. The method of claim 4, wherein said aligning of the first reticle stage with the selected portion of a photoresist film at the inner region of the substrate comprises setting the first reticle stage in an alignment position at which the first reticle stage is disposed in the path of an optical axis extending between the light source and a substrate stage that supports the substrate, and said aligning of the second reticle stage with the selected portion of the photoresist film adjacent the outer peripheral edge of the substrate comprises switching the first and second reticle stages such that the second reticle stage is moved to said alignment position and the first reticle stage is moved from said alignment position to a standby position out of the path of the optical axis.

* * * * *